United States Patent
Cheng et al.

(10) Patent No.: US 7,306,681 B2
(45) Date of Patent: Dec. 11, 2007

(54) METHOD OF CLEANING A SEMICONDUCTOR SUBSTRATE

(75) Inventors: Ya-Lun Cheng, Taipei (TW); Yi-Chia Lee, Taipei (TW); Yu-Ren Wang, Tainan (TW); Neng-Hui Yang, Hsin-Chu (TW)

(73) Assignee: United Microelectronics Corp. (TW)

( * ) Notice: Subject to any disclaimer, the term of this patent is extended or adjusted under 35 U.S.C. 154(b) by 18 days.

(21) Appl. No.: 10/843,444

(22) Filed: May 12, 2004

(65) Prior Publication Data
US 2005/0252525 A1    Nov. 17, 2005

(51) Int. Cl.
B08B 3/00 (2006.01)
(52) U.S. Cl. .................. 134/28; 134/2; 134/3; 134/19; 216/103; 216/104; 216/106; 216/107; 216/108; 216/109; 438/906; 510/175
(58) Field of Classification Search .............. 134/2, 134/3, 19, 26, 28, 27; 216/103, 104, 106, 216/107, 108, 109, 96, 99, 100; 438/906; 510/175
See application file for complete search history.

(56) References Cited

U.S. PATENT DOCUMENTS

| | | | | |
|---|---|---|---|---|
| 4,316,201 A | * | 2/1982 | Christou et al. | 257/12 |
| 6,003,527 A | * | 12/1999 | Netsu et al. | 134/1.3 |
| 6,043,518 A | * | 3/2000 | Hsu et al. | 257/192 |
| 6,165,279 A | * | 12/2000 | Tsao et al. | 134/3 |
| 6,239,045 B1 | * | 5/2001 | Tanaka et al. | 438/507 |
| 6,277,204 B1 | * | 8/2001 | Chang et al. | 134/2 |
| 6,319,331 B1 | * | 11/2001 | Kume et al. | 134/3 |
| 6,635,565 B2 | * | 10/2003 | Wu et al. | 438/637 |
| 6,725,119 B1 | * | 4/2004 | Wake | 700/121 |
| 2005/0176252 A1 | * | 8/2005 | Goodman et al. | 438/692 |

FOREIGN PATENT DOCUMENTS

| | | | |
|---|---|---|---|
| JP | 3-80536 | * | 4/1991 |
| JP | 5-13386 | * | 1/1993 |
| JP | 5-21595 | * | 1/1993 |
| JP | 7-50281 | * | 2/1995 |
| JP | 7-321080 | * | 12/1995 |
| JP | 8-31781 | * | 2/1996 |

* cited by examiner

Primary Examiner—M. Kornakov
(74) Attorney, Agent, or Firm—Squire Sanders & Dempsey LLP (57) ABSTRACT

A cleaning method and cleaning recipes are disclosed. The present invention relates to a method for cleaning a semiconductor substrate and cleaning recipes. The present invention utilizes a first cleaning solution including diluted hydrofluoric acid and a second cleaning solution including hydrogen chloride and hydrogen peroxide ($H_2O_2$) to clean a semiconductor substrate without using an alkaline solution including ammonium hydroxide. Accordingly, a clean surface of a semiconductor substrate is provided in selective epitaxial growth (SEG) process to grow an epitaxial layer with smooth surface.

9 Claims, 9 Drawing Sheets

| Cleaning Steps | #1 | #2 | #3 | #4 |
|---|---|---|---|---|
| DHF | V | V | V | V |
| ($DIH_2O:H_2O_2:NH_4OH$) | V | V | | |
| ($DIH_2O:H_2O_2:HCl$) | | V | | V |
| DHF | V | V | | V |

METHOD OF CLEANING A SEMICONDUCTOR SUBSTRATE

BACKGROUND OF THE INVENTION

1. Field of the Invention

The present invention relates to a method of cleaning a substrate and cleaning recipes, and more particularly to a method of pre-cleaning a wafer and cleaning recipes used for selective epitaxial growth in a raised source/drain process to provide an epitaxial layer with a smooth surface.

2. Description of the Prior Art

Semiconductor devices are constantly being miniaturized. As the overall dimensions of semiconductor devices are made smaller and smaller, the accompanied problems such as short channel effect and junction resistance increasing are also generated. The raised source and drain has then been proposed as an alternative technique for forming a shallow junction in semiconductor devices to eliminate the aforementioned problems. Selective epitaxial growth (SEG) is the mostly used method to form the different types of eitaxy layer on semiconductor substrate, also the important process in raised source and drain technique. Because the surface of the semiconductor substrate is bombarded by ions in the previous implantation procedure, it induces the non-uniformity between two different types of epitaxial surface in the following SEG process, also affects the quality of further fabrication. How to provide a method to eliminate the quality difference in the SEG process to increase the yield of semiconductor devices that is one of the purposes of the present invention.

The cleanliness of a wafer is an important reason for the yield, properties and reliability of devices of VLSI process. More particularly, developing cleaning techniques to provide a substrate with ultra-cleanliness is quite important when the deeply sub-micron field of VLSI process is achieved. Highly pure chemical agents and DI water are used for cleaning process. Cleaning recipes of highly pure Wet Chemical Cleaning, which is developed by RCA Company in America, are used for many years. A little adjustments of the ratio of chemical recipes and cleaning sequences are developed. Reducing cleaning steps and raising cleanliness are improved, and wherein the micro-particles, oxides, mineral elements, organic and metals are the major objects to remove away.

Figure 1:
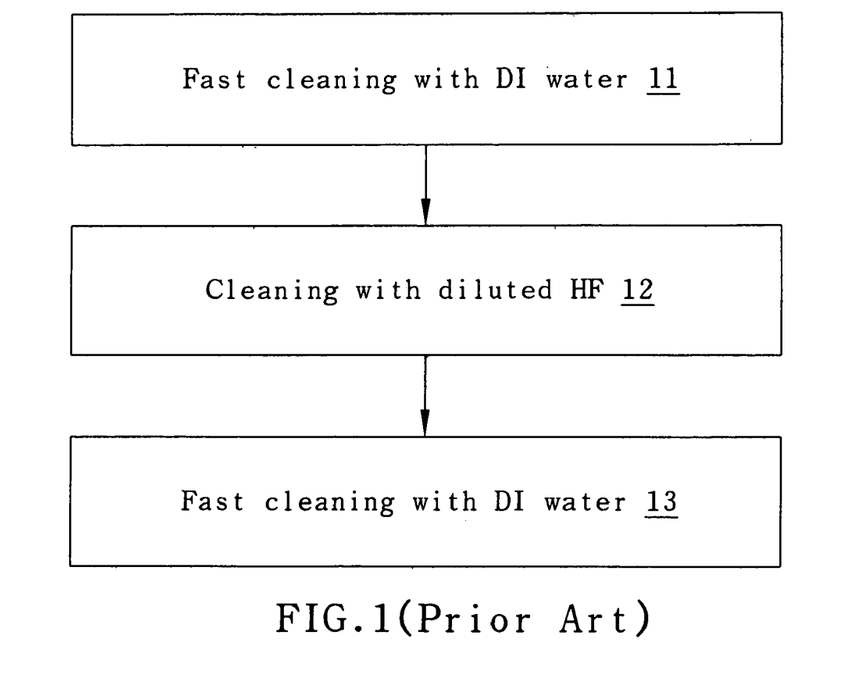
FIG. 1 is a prior art flow chart of cleaning steps.

Referring to FIG. 1, a flow chart of pre-clean steps of SEG process according to traditional cleaning steps is shown. The pre-clean steps include the following steps. In step 11, deionized (DI) water is used for fast cleaning. In step 12, a diluted hydrofluoric acid is utilized to remove the remained oxide. In step 13, deionized water is used for fast cleaning.

Figure 2A:
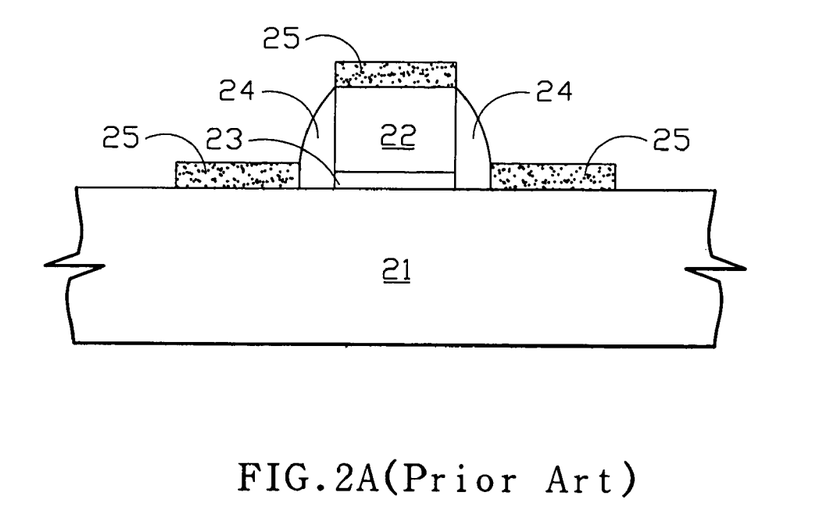
FIG. 2A shows a MOS transistor with selective epitaxial layers formed by conventional SEG techniques.
Figure 2B:
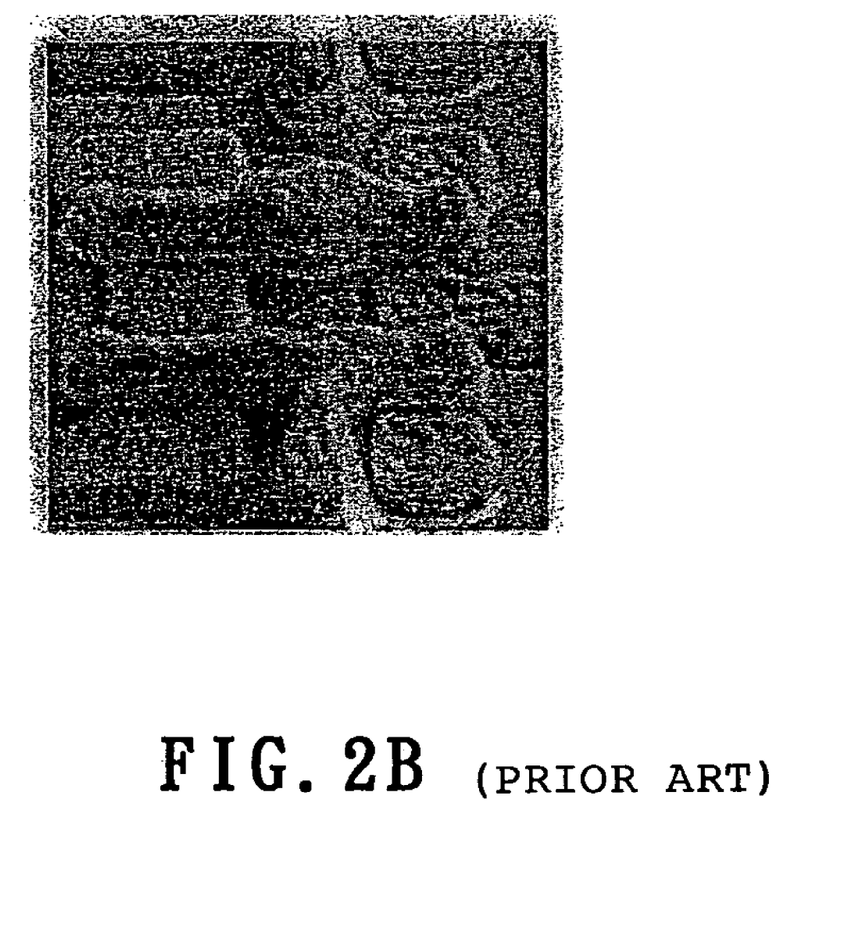
FIG. 2B shows a SEM picture of a surface of an epitaxial layer formed after utilizing the conventional cleaning steps.

Referring to FIG. 2A, a MOS transistor with selective epitaxial layers formed by conventional SEG techniques is shown. The MOS transistor formed on a silicon substrate 21 comprises a polysilicon gate electrode 22, a gate oxide layer 23, an epitaxial layer 25 and a spacer 24. Before forming the epitaxial layer 25, a conventional pre-clean steps of SEG such as the one shown in FIG. 1 is utilized. In a raised source/drain process, the qualities of epitaxial layers on the P+ region and the N+ region are different. Particularly, the surface condition of the epitaxial layer on the N+ region is poor and rough. FIG. 2B shows a SEM picture of an epitaxial layer and a rough surface of the epitaxial layer on the N+ region. The roughness of the surface of the epitaxial layer would degrade the quality of following forming films thereby deteriorate the performance of devices and production yield thereof.

In view of the drawbacks mentioned with the prior art process, there is a continued need to develop new and improved processes that overcome the disadvantages associated with prior art processes. The requirements of this invention are that it solves the problems mentioned above.

SUMMARY OF THE INVENTION

It is one object of the present invention to provide a method for cleaning a semiconductor substrate using a solution having hydrogen chloride acid and a solution having DHF (HF/H2O) so as to provide a substrate with clean surface before an epitaxial process.

It is another object of the present invention to provide cleaning recipes including a solution having HCl, $H_2O_2$ and H2O and a solution having DHF so as to provide a substrate with clean surface for SEG process.

BRIEF DESCRIPTION OF THE DRAWINGS

The objectives and features of the present invention as well as advantages thereof will become apparent from the following detailed description, considered in conjunction with the accompanying drawings.

DESCRIPTION OF THE EMBODIMENTS

The present invention will be described in detail with reference to the accompanying drawings. The present invention provides a method of surface pretreatment before selective epitaxial growth process and cleaning recipes, which can resolve the undercut issue and surface roughness of the epitaxial layer.

Figure 3:
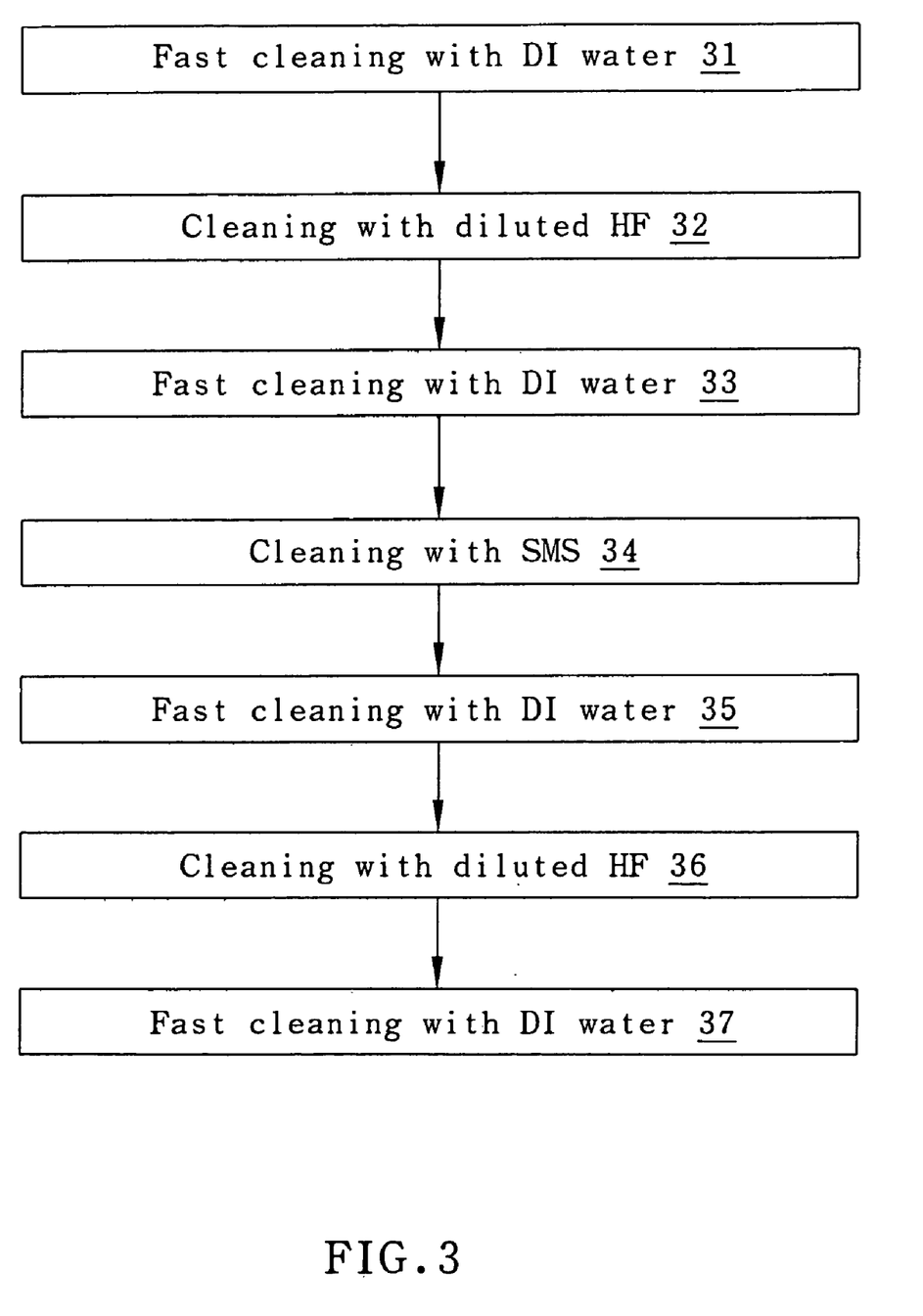
FIG. 3 is a flow chart of cleaning steps according to a preferred embodiment of the present invention.

Referring to FIG. 3, a flow chart of cleaning steps used in SEG of semiconductor process according to the preferred embodiment of the present invention is shown. In step 31, deionized (DI) water is used for fast cleaning. In step 32, a diluted acid solution is utilized for cleaning. The diluted acid solution comprises a diluted hydrofluoric acid (DHF, DI water:HF=100:1~300:1) to remove the remained oxide. In step 33, deionized water 33 is used for fast cleaning. In step 34, an acid solution is utilized for cleaning. The acid solution comprises a surface modifier solution (SMS) used to define surface micro-states with a concentration range which is about (HCl: 20~50%, $H_2O_2$: 20~40%) and at a temperature in a range of about 40~80° C. In step 35, deionized water is used for fast cleaning. In step 36, a diluted acid solution is utilized for cleaning. The diluted acid solution comprises a diluted hydrofluoric acid (DHF, DI water:HF=100:1~300:1) to avoid growing native oxide in selective epitaxial growth (SEG) process. In step 37, deionized water is used for fast cleaning. The purpose of the cleaning steps is to get a clean surface of a substrate used for selective epitaxial growth (SEG) processes.

Figure 4A:
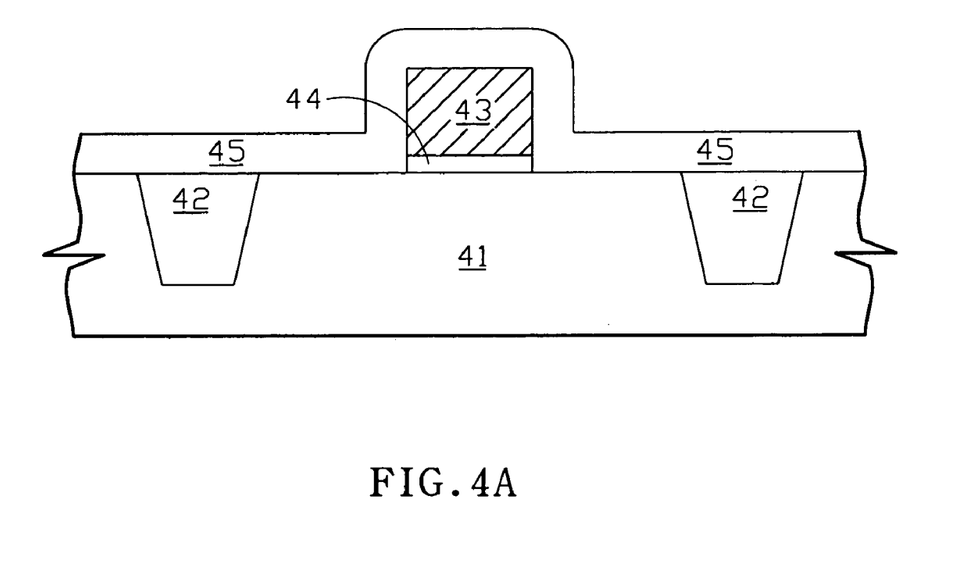
FIG. 4A to 4C show an epitaxial process flow utilizing the cleaning steps of a preferred embodiment of the present invention.
Figure 4B:
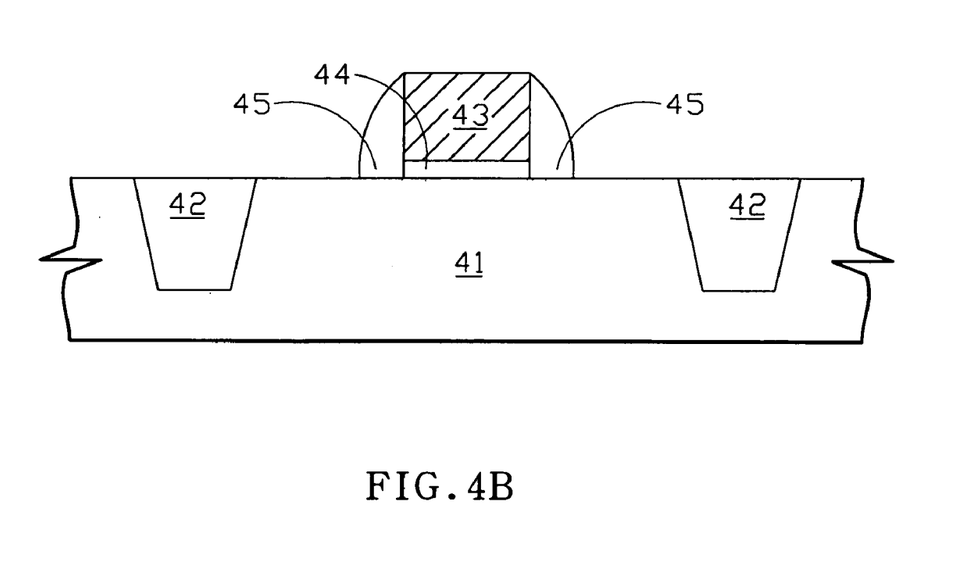
Figure 4C:
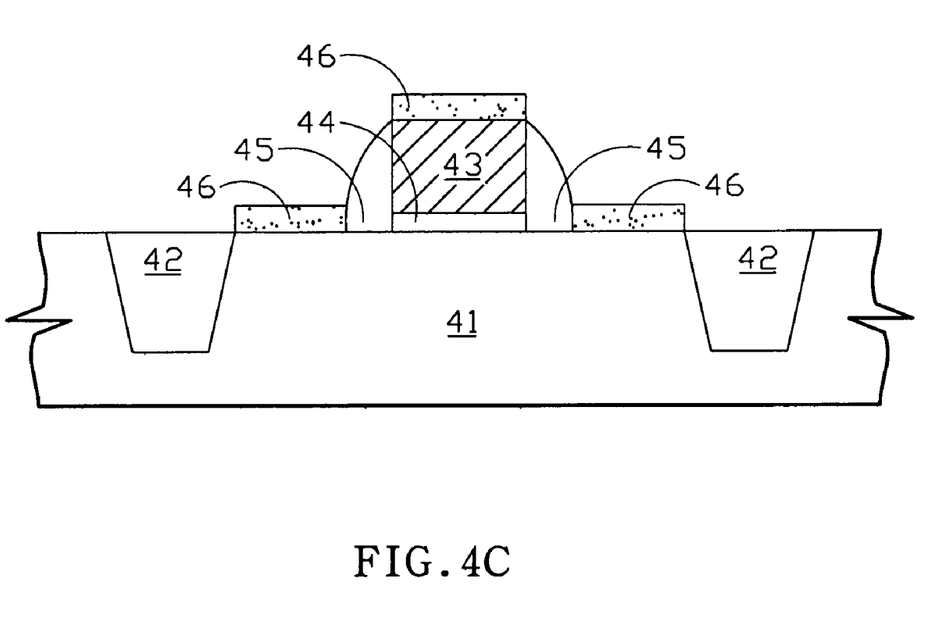
Figure 4D:
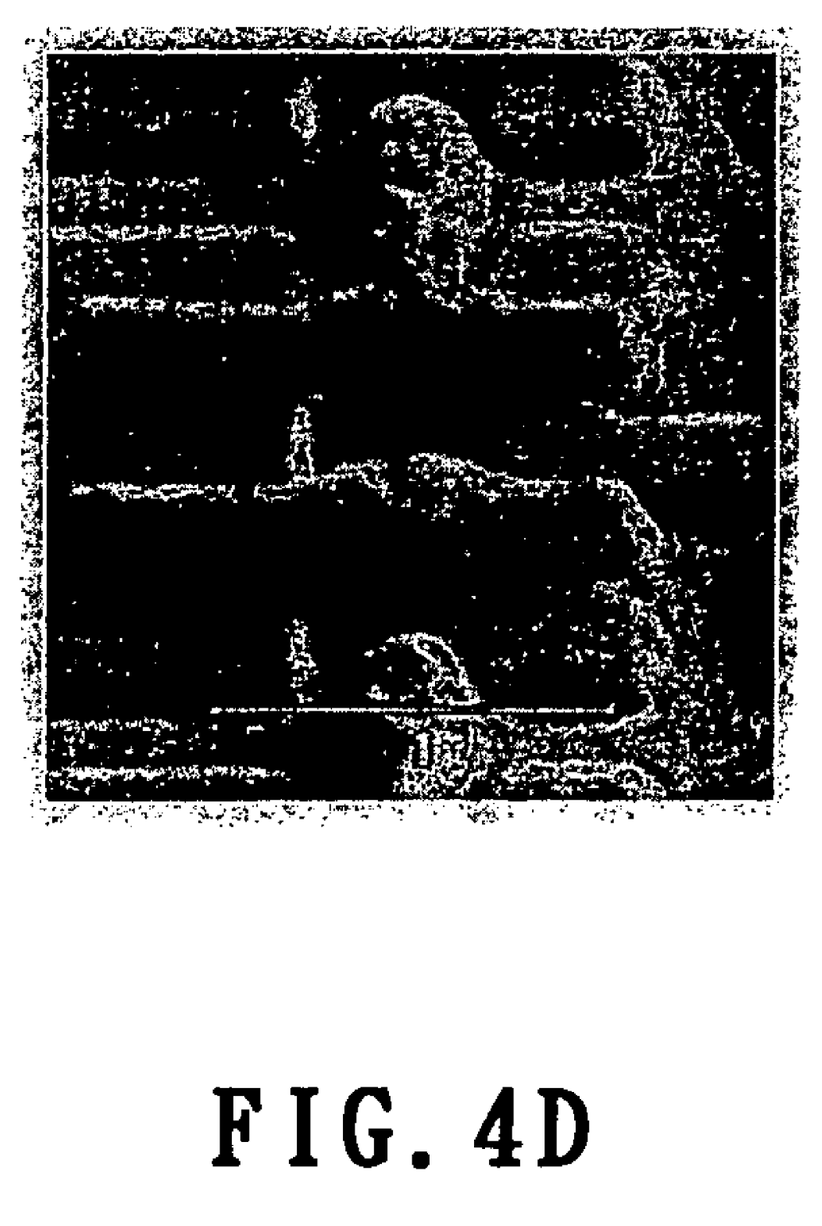
FIG. 4D shows a SEM picture of a surface of an epitaxial layer formed after utilizing the cleaning steps of a preferred embodiment of the present invention.
Figure 5A:
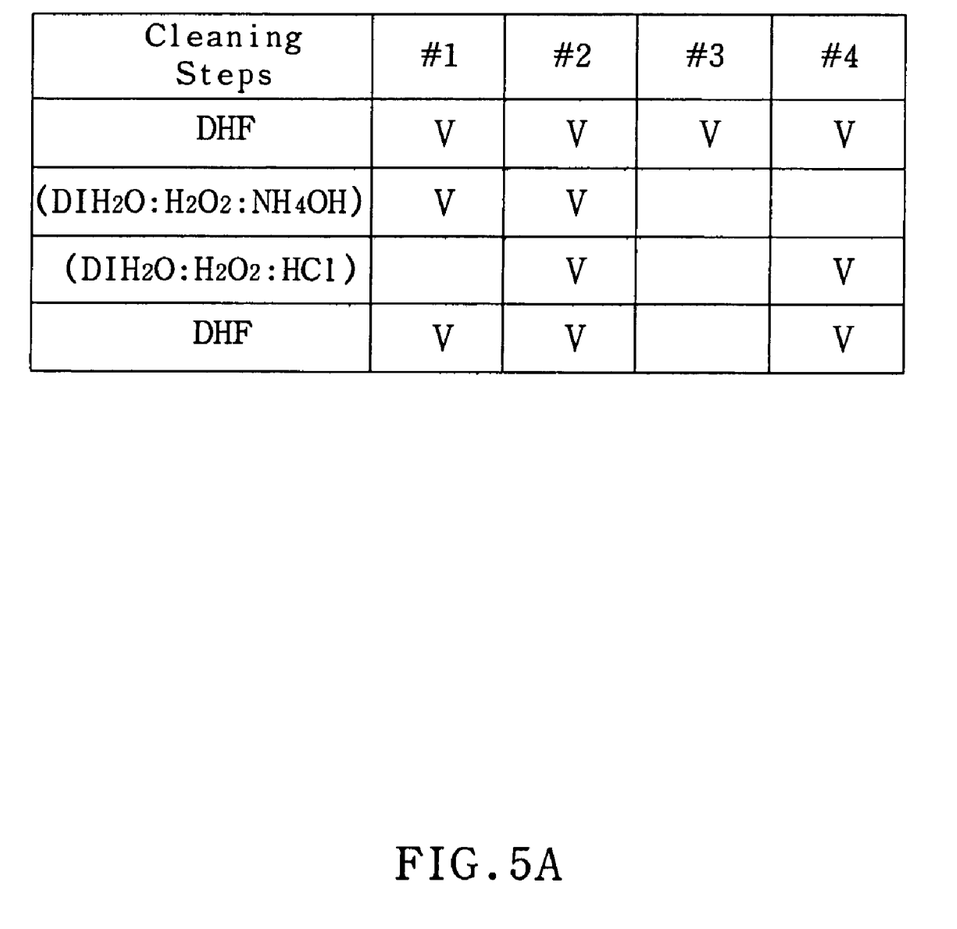
FIG. 5A #1 to #3 and FIG. 5A #4 is a list table of various cleaning steps according to the prior arts and the preferred embodiment of the present invention.
Figure 5B:
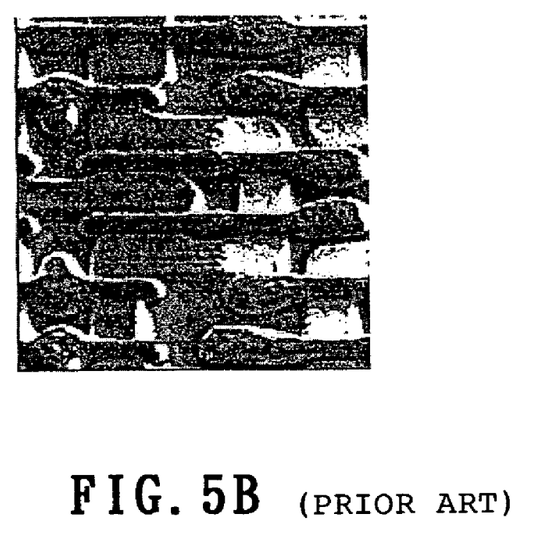
FIG. 5B to FIG. 5D show the SEM pictures according to the cleaning steps of # 1 to #3 of FIG. 5A respectively.
Figure 5C:
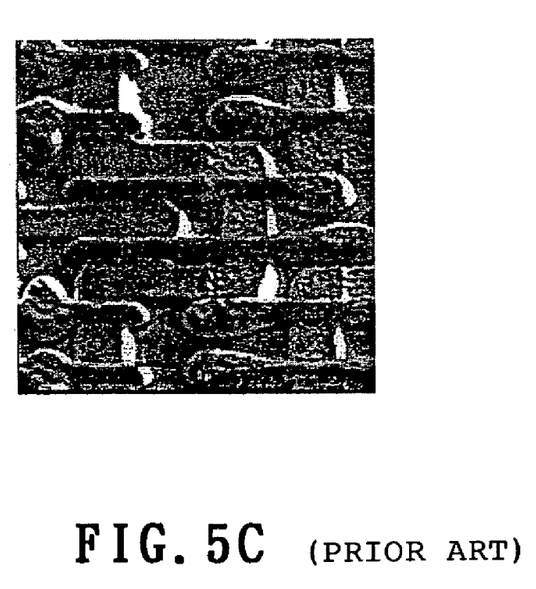
Figure 5D:
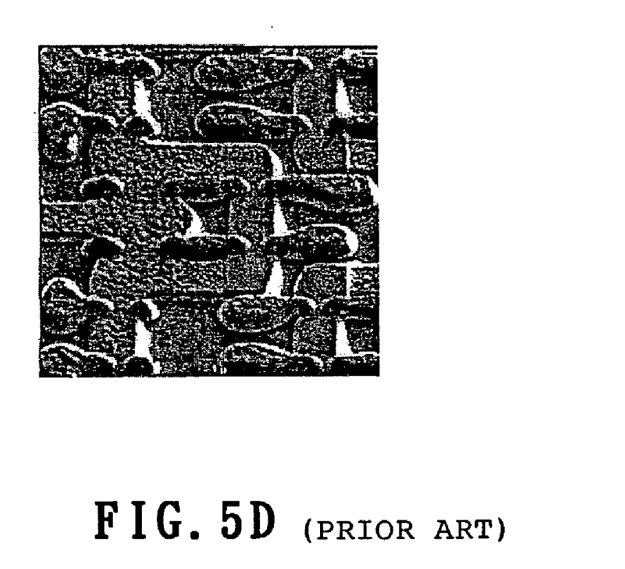
Figure 5E:
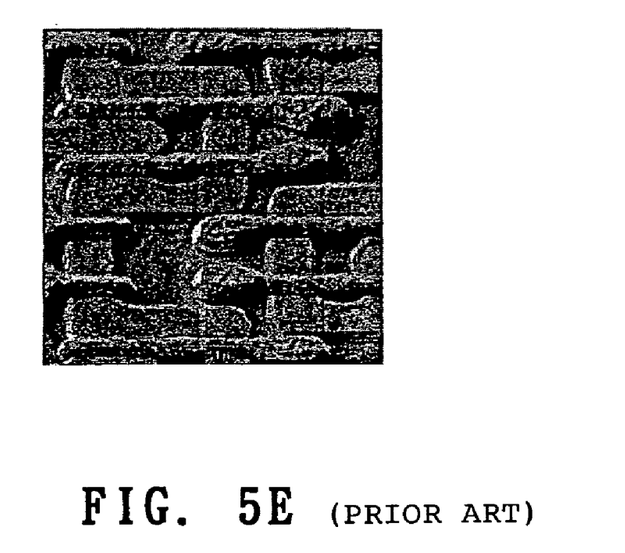
FIG. 5E shows the SEM picture according to the cleaning steps of #4 of FIG. 5A.

FIG. 4A to 4C show an epitaxial process flow utilizing the cleaning steps of a preferred embodiment of the present invention. As shown in FIG. 4A, a gate dielectric layer 44 is formed on a substrate 41 and a gate electrode 43 is formed on the gate dielectric layer 44. Shallow trench isolations 42 are formed in the substrate 41 and a dielectric layer 45 is formed over the substrate 41. The dielectric layer 45 is then etched to form a spacer 45 as shown in FIG. 4B. Before growing an epitaxial layer 46 by a selective epitaxial growth (SEG) process as shown in FIG. 4C, cleaning steps according to the preferred embodiment of the present invention are performed so as to obtain predetermined active regions with smooth surface. FIG. 4D shows a SEM picture of a surface of an epitaxial layer formed after utilizing the cleaning steps of a preferred embodiment of the present invention FIG. 5A shows a list table of various cleaning steps according to the prior arts and the present invention. The cleaning steps #1 to #3 and #4 in FIG. 5A are cleaning steps according to the prior arts and the present invention respectively. FIG. 5B to FIG. 5D show the SEM pictures of epitaxial layers formed after utilizing the cleaning steps #1 to #3 of FIG. 5A respectively. FIG. 5E shows the SEM picture of an epitaxial layer formed after utilizing the cleaning steps #4 of FIG. 5A.

The cleaning steps #1 of FIG. 5A include a step of cleaning a substrate with DHF having a concentration range which is about (DI $H_2O$:HF=100:1~300:1), a step of cleaning with APM ($NH_4OH/H_2O_2/DI\ H_2O$) to remove particles on the surface, and a step of cleaning with DHF having a concentration range which is about (DI $H_2O$:HF=100:1~300:1). All cleaning steps are performed subsequently accompanied with fast cleaning using DI Water after each step. The SEM picture of the epitaxial layer formed after utilizing the cleaning steps #1 of FIG. 5A is shown in FIG. 5B.

The cleaning steps #2 of FIG. 5A include a step of cleaning a substrate with DHF having a concentration range which is about (DI $H_2O$:HF=100:1~300:1), a step of cleaning with APM ($NH_4OH/H_2O_2/DI\ H_2O$) to remove particles on the surface, a step of cleaning with Surface Modifier Solution (SMS) of $HCl/H_2O_2/DI\ H_2O$ having a concentration range which is about (HCl %:20~50%, $H_2O_2$%: 20~40%) at a temperature in a range of about 40~80° C., and a step of cleaning with DHF having a concentration range which is about (DI $H_2O$:HF=100:1~300:1). All cleaning steps are performed subsequently accompanied with fast cleaning using DI Water after each step. The SEM picture of the epitaxial layer formed after utilizing the cleaning steps #2 of FIG. 5A is shown in FIG. 5C.

The cleaning step #3 of FIG. 5A includes a step of cleaning a substrate with DHF having a concentration range which is about (DI $H_2O$:HF=100:1~300:1). The SEM picture of the epitaxial layer formed after utilizing the cleaning steps #3 of FIG. 5A is shown in FIG. 5D.

The cleaning steps #4 of FIG. 5A according to the preferred embodiment of the present invention include a step of cleaning a substrate with DHF having a concentration range which is about (DI $H_2O$:HF=100:1~300:1), a step of cleaning with Surface Modifier Solution (SMS) of $HCl/H_2O_2/H_2O$ having a concentration range which is about (HCl %:20~50%, $H_2O_2$%:20~40%) at a temperature in a range of about 40° C.~80° C., and a step of cleaning with DHF having a concentration range which is about (DI $H_2O$:HF=100:1~300:1). All cleaning steps are performed subsequently accompanied with fast cleaning using DI Water after each step. The SEM picture of the epitaxial layer formed after utilizing the cleaning steps #4 of FIG. 5A is shown in FIG. 5E. Comparing the SEM pictures shown in FIG. 5B to 5D and FIG. 5E, a smooth surface of an epitaxial layer according to the preferred embodiment of the present invention is provided.

The embodiments are only used to illustrate the present invention, not intended to limit the scope thereof. Many modifications of the embodiments can be made without departing from the spirit of the present invention.

What is claimed is:

1. A method for cleaning a semiconductor substrate, comprising the steps of:
    (a) providing a semiconductor substrate comprising a gate electrode surrounded by a spacer, and a plurality of shallow trench isolations and a plurality of exposed regions of said semiconductor substrate between said gate electrode and said shallow trench isolations before performing a selective epitaxial growth;
    (b) cleaning a surface of said semiconductor substrate with a first acid solution consisting of hydrofluoric acid and deionized water, wherein said first acid solution is diluted with deionized water with a ratio of DI $H_2O$:HF=100:1 to 300:1; and
    (c) cleaning the surface of said semiconductor substrate with a second acid solution consisting of hydrogen chloride acid and hydrogen peroxide ($H_2O_2$) and deionized water,
    wherein said semiconductor substrate is not cleaned with a mixture of ammonium hydroxide ($NH_4OH$), hydrogen peroxide ($H_2O_2$) and deionized water, before the step (c) and after the step (b),
    whereby said selective epitaxial growth is performed on said semiconductor substrate after said steps (a), (b), and (c).

2. The method according to claim 1, further comprising a step of cleaning said semiconductor substrate with a third acid solution including hydrofluoric acid after the step of cleaning said semiconductor substrate with the second acid solution, wherein said-third acid solution is diluted with deionized water with a ratio of DI $H_2O$:HF=100:1 to 300:1.

3. The method according to claim 1, wherein the step of cleaning said semiconductor substrate with the second acid solution is performed at a temperature in a range of about 40° C. to about 80° c.

4. The method according to claim 1, wherein a concentration of the hydrogen chloride of the second acid solution is about 20% to about 50%.

5. The method according to claim 1, wherein a concentration of the hydrogen peroxide ($H_2O_2$) of the second acid solution is about 20% to about 40%.

6. A method for cleaning a semiconductor substrate, comprising the steps of:
    (a) providing a semiconductor substrate comprising a gate electrode surrounded by a spacer, and a plurality of shallow trench isolations and a plurality of exposed regions of said semiconductor substrate between said gate electrode and said shallow trench isolations before performing a selective epitaxial growth;
    (b) removing an oxide residue on a surface of said semiconductor substrate by using a first acid solution consisting of hydrofluoric acid (HF) and deionized water, wherein said first acid solution is diluted with deionized water with a ratio of DI H$_2$O:HF=100:1 to 300:1;

(c) modifying a state of the surface of said semiconductor substrate by using a second acid solution consisting of hydrogen chloride (HCl) and hydrogen peroxide (H$_2$O$_2$) and deionized water, and (d) preventing the surface of said semiconductor substrate from growing native oxide by using a third acid solution consisting of—hydrofluoric acid (HF) and deionized water, said third acid solution is diluted with deionized water with a ratio of DI H$_2$O:HF=100:1 to 300:1, wherein said semiconductor substrate is not cleaned with a mixture of ammonium hydroxide (NH$_4$OH), hydrogen peroxide (H$_2$O$_2$) and deionized water, before the step (c) and after the step (b), whereby said selective epitaxial growth is performed on said semiconductor substrate after said steps (a), (b), and (c).

7. The method according to claim 6, wherein the step of modifying a state of the surface of said semiconductor substrate is performed at a temperature in a range of about 40° C. to about 80° C.

8. The method according to claim 6, wherein a concentration of the hydrogen peroxide of said second acid solution is about 20% to about 40%.

9. The method according to claim 6, wherein a concentration of the hydrogen chloride of said second acid solution is about 20% to about 50%.

* * * * *